United States Patent [19]

Miller

[11] 3,997,859

[45] Dec. 14, 1976

[54] INTERMITTENT LOAD ENERGIZER ASSEMBLY

[75] Inventor: Gerald K. Miller, Hersey, Mich.

[73] Assignee: Nartron Corporation, Reed City, Mich.

[22] Filed: Apr. 3, 1975

[21] Appl. No.: 564,930

Related U.S. Application Data

[62] Division of Ser. No. 491,763, July 25, 1974.

[52] U.S. Cl. .............................. 335/128; 335/276
[51] Int. Cl.² ..................................... H01H 50/58
[58] Field of Search .......... 335/128, 187, 276, 281, 335/279

[56] References Cited

UNITED STATES PATENTS

| | | | |
|---|---|---|---|
| 2,076,857 | 4/1937 | Morgenstern | 335/276 |
| 2,867,702 | 1/1959 | Rice | 335/187 |
| 2,914,632 | 11/1959 | Neumann | 335/187 |
| 3,048,749 | 8/1962 | Koehler | 335/276 |
| 3,340,487 | 9/1967 | Gruner et al. | 335/279 |
| 3,451,022 | 6/1969 | Krautwald et al. | 335/281 |

FOREIGN PATENTS OR APPLICATIONS 961,329  6/1964  United Kingdom ............... 335/276

Primary Examiner—Harold Broome
Attorney, Agent, or Firm—Lon H. Romanski

[57] ABSTRACT

A relay assembly has a field coil with a first core carried generally therewithin and a second core situated generally externally thereof; the second core has first, second and third upwardly directed legs with such first and second legs having upper disposed terminal surfaces; a base portion joins the first, second and third legs to each other and further supports a lower end of the first core; a resiliently deflectable armature has downwardly directed terminal surfaces which move toward the upper terminal surfaces upon energization of the coil during which the three legs in cooperation with the first core and base serve to provide three magnetic flux loops.

13 Claims, 19 Drawing Figures

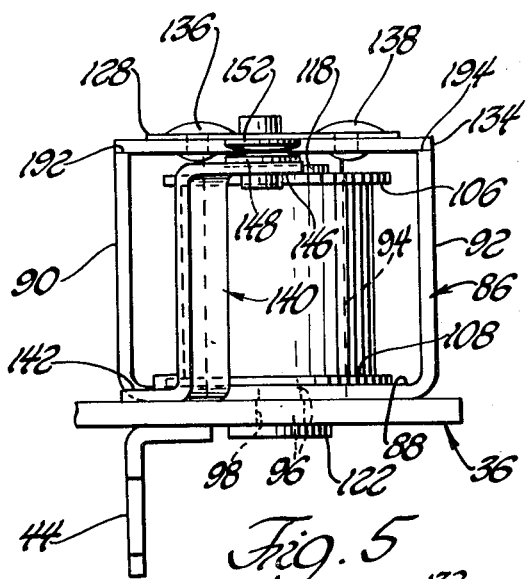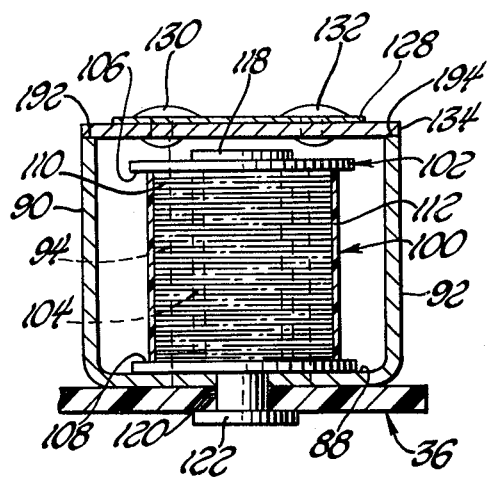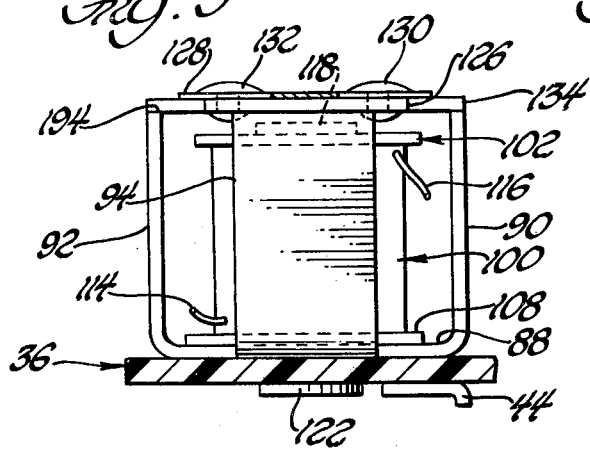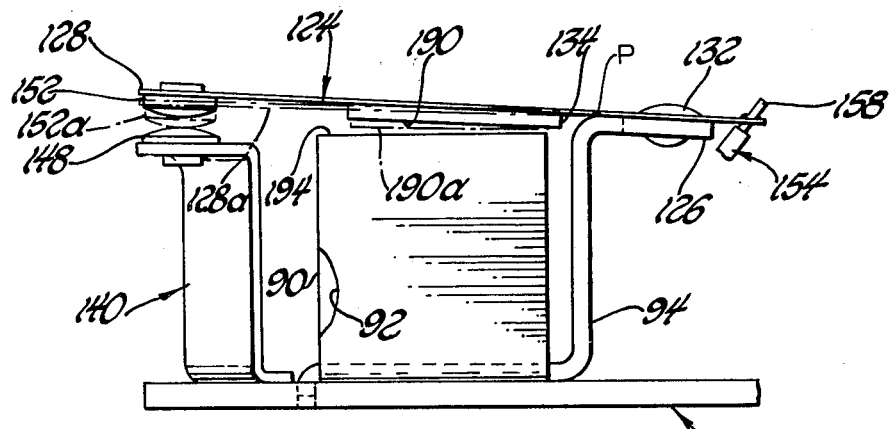

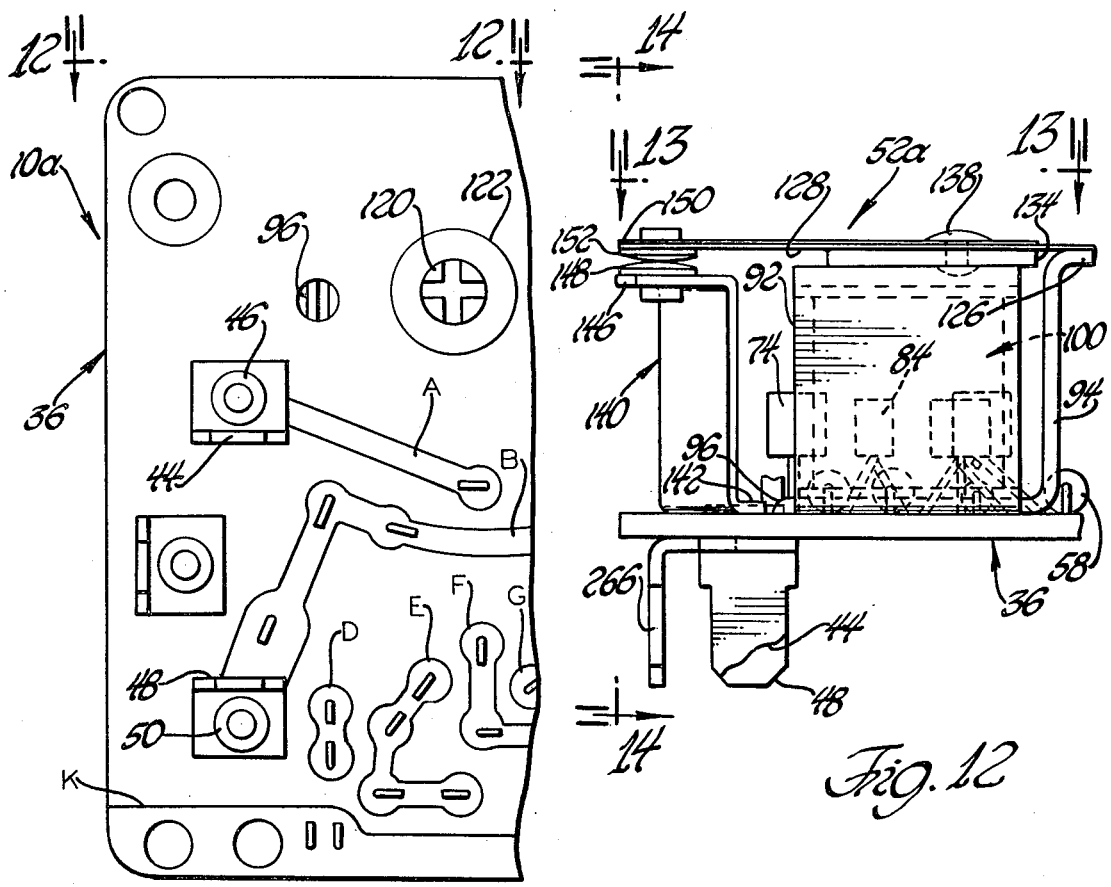
Fig. 11
Fig. 12
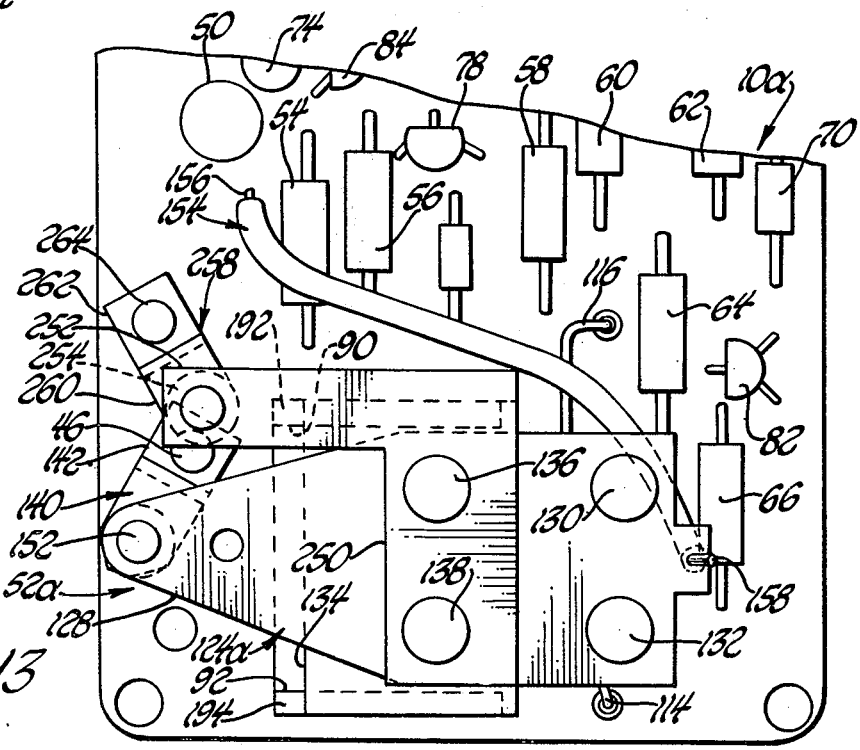
Fig. 13

3,997,859

1

INTERMITTENT LOAD ENERGIZER ASSEMBLY

RELATED APPLICATION

This application is a Division of my co-pending application Ser. No. 491,763, filed July 25, 1974, for INTERMITTENT LOAD ENERGIZER AND CIRCUIT MEANS.

BACKGROUND OF THE INVENTION

The prior art has proposed various forms of intermittent electrical load energizer assemblies employed or employable in capacities as, for example, lamp flasher assemblies.

Such prior art flasher assemblies fall into the following categories, for example (a) "solid state" which are characterized by having no moving parts but which are physically relatively large because of all the various features required therein for protection against possibly destructive electrical, thermal and mechanical shock forces developed by associated structure; (b) "spring mass" oscillating flashers which employ a time-escapement mechanism, similar to a watch mechanism, whereby a pendulum carries a movable contact engageable with a mating or coacting fixed contact; such, because of their inherent design, are considerably sensitive to shock and vibration; (c) "thermal" flashers which, generally, employ either a vane or blade to provide for moving of an electrical contact as a function of a force caused by the heating of a resistance wire or a resistance ribbon; in the vane type, for example, the resistance wire is in series with the electrical contacts and when current flows in the circuit, the resistance wire elongates sufficiently to allow the vane to snap to its original configuration and, of course, the oscillation is provided by alternate heating and cooling of such resistance wire or ribbon; and (d) "magnetic" flashers which employ a magnetic field for both creating the oscillation cycle and opening and closing related electrical load circuit means.

The various intermittent energizer means heretofore proposed by the prior art have various deficiencies, such as, for example, over-burdening space requirements, and high susceptibility to failure due to causes arising out of heat, mechanical shock and/or vibrations and transient voltage conditions in related structure.

Accordingly, the invention as herein disclosed and described is primarily directed to the solution of the above and other attendant and related problems.

SUMMARY OF THE INVENTION

According to the invention, a flasher system for intermittently supplying electrical energy from a source of electrical potential to related electrical load means comprises timing circuit means, said timing circuit means comprises first semiconductor means effective for creating an intermittent electrical timing signal, second semiconductor means, relay means, and electrical contact means the opening and closing of which is controlled by said relay means, said second semiconductor means being adapted to be intermittently placed into a conductive state and a non-conductive state in response to the presence and absence of said timing signal, said second semiconductor means being effective when in one of said states to supply current flow from said source to said relay means, and said electrical contact means being effective when closed to supply current flow from said source to said related electrical load means.

BRIEF DESCRIPTION OF THE DRAWINGS

In the drawings, wherein for purposes of clarity certain details and/or elements may be omitted while others may be illustrated in simplified form:

FIG. 5 is a view taken generally on the plane of line 5—5 of FIG. 3 and looking in the direction of the arrows;

FIG. 6 is a cross-sectional view taken generally on the plane of line 6—6 of FIG. 3 and looking in the direction of the arrows;

FIG. 7 is a cross-sectional view taken generally on the plane of line 7—7 of FIG. 3 and looking in the direction of the arrows;

FIG. 8 is a view similar to that of FIG. 3 but in simplified form illustrating in greater detail the preferred form and/or relationships of selected various elements;

FIG. 11 is a view, similar to that of FIG. 2, illustrating, fragmentarily, a second embodiment of the invention;

FIG. 12 is a side elevational view taken generally on the plane of line 12—12 of FIG. 11 and looking in the direction of the arrows;

FIG. 13 is a view taken generally on the plane of line 13—13 of FIG. 12 and looking in the direction of the arrows;

DETAILED DESCRIPTION OF THE INVENTION

Figure 1:
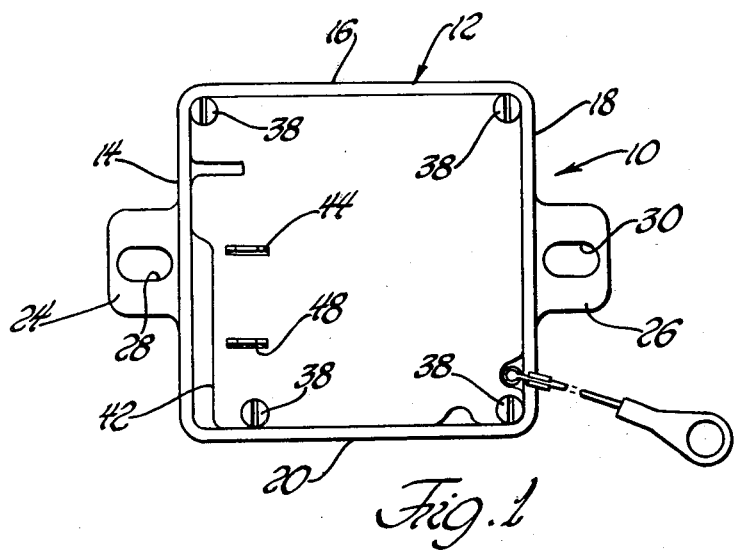
FIG. 1 is a plan view of a flasher assembly constructed in accordance with the teachings of the invention.
Figure 2:
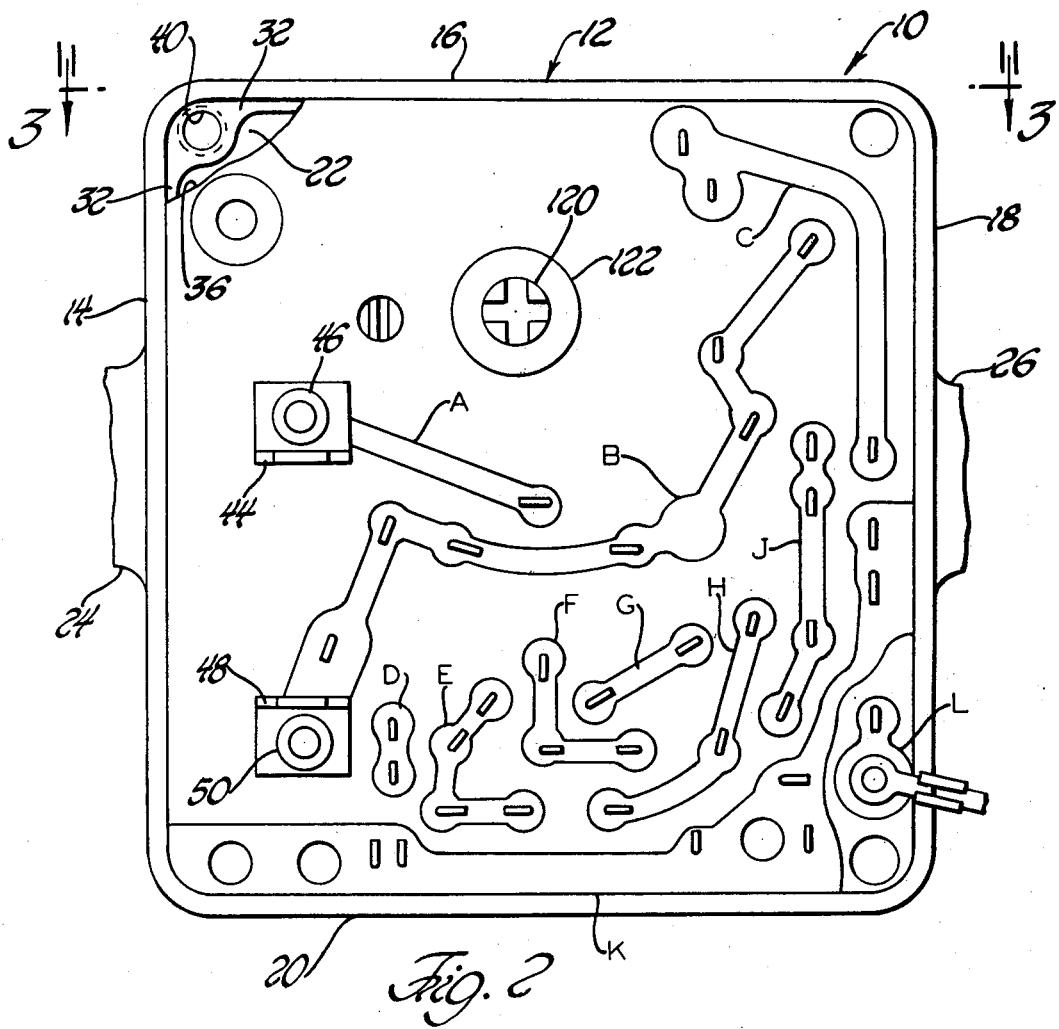
FIG. 2 is an enlarged view of the assembly of FIG. 1 with certain portions thereof broken away and with one of the elements shown in FIG. 1 removed.

Referring now in greater detail to the drawings, FIGS. 1 and 2 illustrate the flasher assembly 10 as comprising a housing 12 having side walls 14, 16, 18 and 20 with an integrally formed transversely extending end closure wall (a portion of which is shown at 22 of FIG. 2). Laterally extending tabs or ears 24 and 26, formed integrally with side walls 14 and 18, are respectively provided with elongated slots 28 and 30 formed therethrough as to thereby accommodate screws or other suitable fastening means (not shown) for securing the assembly 10 to related structure.

The housing walls 14, 16, 18 and 20 have a stepped inner peripherally extending surface 32 against which the inner surface 34 of a printed circuit board 36 is mounted and secured as by screws 38 cooperatively threadably received as within apertures formed in the housing 12 as typically illustrated at 40 of FIG. 2. The cooperating side walls 14, 16, 18 and 20 and end wall 22 along with printed circuit board 36, also serving as an end wall, define a housing chamber containing various components to be described.

As can be seen in FIG. 1, a shielding-like cover plate 42, formed of any suitable dielectric material, may be applied over the printed circuit board 36, if desired. In certain embodiments of the invention, such cover member 42 has taken the form of thin paper-like stock with a product-identification label on the exterior surface.

As shown in FIG. 2, the exterior surface of the circuit board 36 has a plurality of printed circuit portions A, B, C, D, E, F, G, H, J, K and L formed and carried thereon. A first blade-like terminal 44 is secured, as by an electrically conductive rivet 46, to the outer or exterior surface of board 36 in a manner as to be in electrical contact with one end of printed circuit portion A. Similarly, a second blade-like terminal 48 is secured, as by an electrically conductive rivet 50, to the outer or exterior surface of board 36 in a manner as to be in electrical contact with one end of printed circuit portion B.

Figure 3:
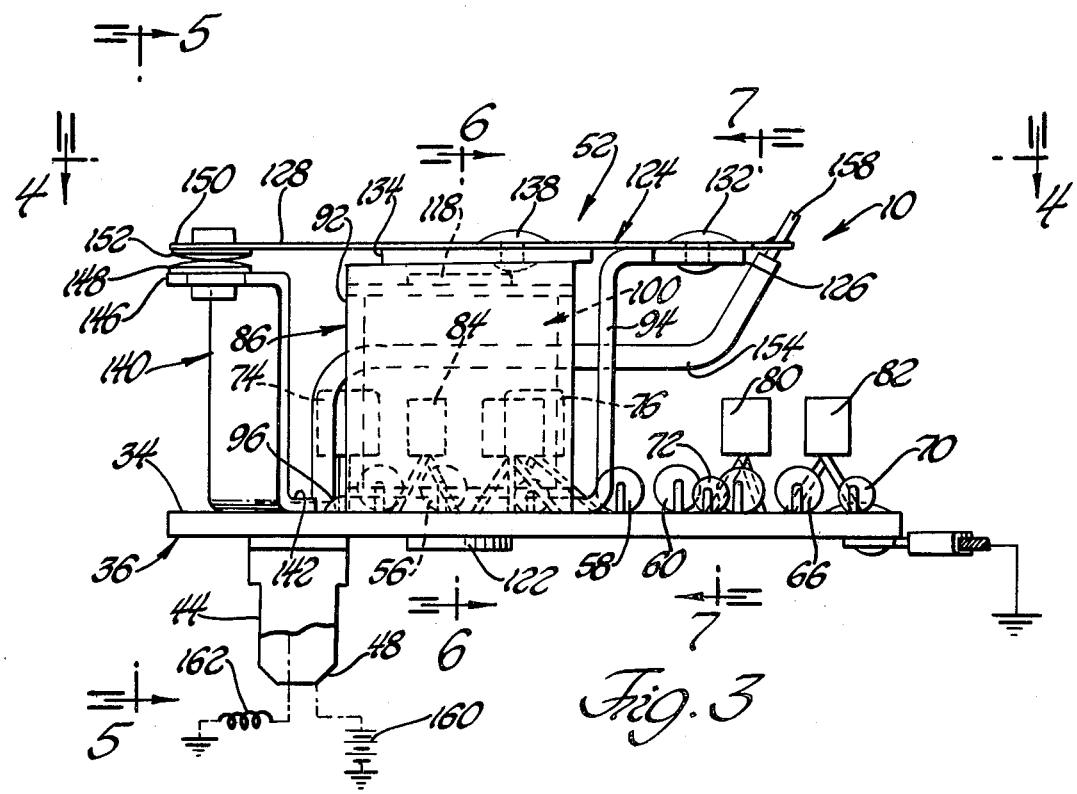
FIG. 3 is a view taken generally on the plane of line 3—3 of FIG. 2 but with the cover-like housing omitted.
Figure 4:
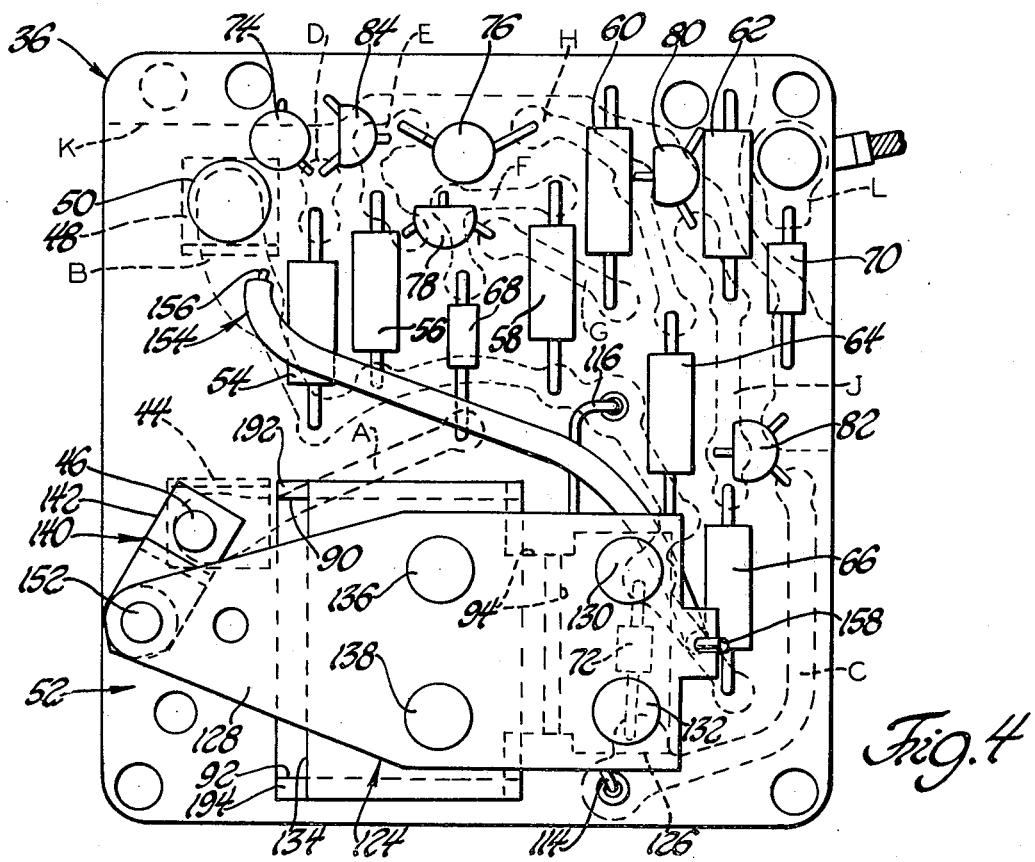
FIG. 4 is a view taken generally on the plane of line 4—4 of FIG. 3 and looking in the direction of the arrows.

FIGS. 3 and 4 illustrate a relay assembly 52 and various other electrical components secured to and carried generally on or along the inner surface 34 of circuit board 36 as to occupy the chamber defined by the housing means. More particularly a first resistor 54 has its opposite ends electrically connected to circuit portions B and D, a second resistor 56 has its opposite ends electrically connected to circuit portions B and E, a third resistor 58 has its opposite ends electrically connected to circuit portions B and F, a fourth resistor 60 has its opposite ends electrically connected to circuit portions G and K, a fifth resistor 62 has its opposite ends electrically connected to circuit portions J and K, a sixth resistor 64 has its opposite ends electrically connected to circuit portions B and H, and a seventh resistor 66 has its opposite ends electrically connected to circuit portions B and J.

A first diode 68 has its opposite ends electrically connected to circuit portions A and F, a second diode 70 has its opposite ends electrically connected to circuit portions K and L, while a third diode 72 has its opposite ends electrically connected to circuit portions C and B.

A first capacitor 74 has its opposite sides electrically connected to circuit portions D and K while a second capacitor 76 has its opposite sides electrically connected to circuit portions E and H.

A plurality of transistors 78, 80 and 82 are also provided with transistor 78 being electrically connected to circuit portions E, F and G, transistor 80 being electrically connected to circuit portions H, K and J while transistor 82 is electrically connected to circuit portions J, K and C. An additional unijunction transistor 84 is electrically connected to circuit portions K, E and D.

Referring to FIGS. 3, 4, 5, 6 and 7, the relay assembly 52 is illustrated as comprising an outer core 86 having a base portion 88 with upwardly directed side wall-like or leg portions 90 and 92 integrally formed therewith. A third upwardly directed leg portion 94 is also integrally formed with base 88. A finger-like tab 96, also formed integrally with base 88, depends downwardly and is received within a suitable cooperating aperture or recess 98, formed in board 36, to thereby provide for relative angular positioning of the outer core 86. The entire outer core 86 is made of a ferrous material so as to provide for a magnetic flux path.

A winding or coil assembly 100 is illustrated as being comprised of a spool 102 having a centrally situated tubular portion 104 terminating at its opposite ends in radically extending upper and lower flange portions 106 and 108 which, in turn, axially contain a winding 110 wound about tubular portion 104. If desired, an outer cover portion 112 may be provided. As fragmentarily illustrated in FIG. 7, the winding 110 has one end 114 which, as shown in FIG. 4, is electrically connected to circuit portion C, and a second end 116 which, as shown in FIG. 4, is electrically connected to printed circuit portion B. A centrally disposed vertically extending inner core 118 of ferrous material, preferably of cylindrical configuration, is received within spool tubular portion 104. The lower end of inner core 118 has a shank portion 120 extending through and engaging outer core base 88 as to preferably complete contact therewith. Shank portion 120 also extends through circuit board 36 and a washer-like retainer 122 wherein the end of shank 120 is peened as to thereby axially secure the coil assembly 100, outer core 86 and inner core 118 to the circuit board 36 while relative angular alignment is achieved as by the finger-like locator 96 previously described.

An armature assembly 124 is operatively connected to and carried by a laterally extending flange-like mounting portion 126 integrally formed with and at the upper end of leg 94 thereby defining a pedestal-like structure with the armature assembly 124 being cantilevered therefrom.

The armature assembly is preferably comprised of a relatively thin electrically conductive resilient member 128 which is secured at one end to mounting flange 126 as by electrically conductive rivets 130 and 132. In the preferred embodiment, member 128 is comprised of beryllium copper. Generally intermediate opposite ends of member 128, an additional armature plate 134 is carried by and secured to arm member 128 as by electrically conductive rivets 136 and 138. In the preferred embodiment armature plate 134 is comprised of mild steel as, for example, a grade 1020 steel.

A vertically extending electrically conductive pedestal or bracket-like member 140 having a base portion 142 suitably secured to circuit board 36 and blade-type terminal 44 as by an electrically conductive rivet 46 has a laterally extending flange-like portion 146 which carries an electrical contact 148, preferably with a crowned contact surface, thereon and suitably secured thereto.

The free or swingable end 150 of resilient armature plate 128 is similarly provided with an electrical contact 152, also preferably having a crowned contact surface, which is suitably secured thereto in electrically conductive relationship therewith. An electrical conductor 154, as shown in FIGS. 3 and 4, has one end 156 electrically connected to printed circuit portion B while its other end 158 is suitably electrically connected, as by soldering, to a tab at the fixed end of armature plate 128.

The views of FIGS. 3, 4, 5, 6 and 7 have been, for sake of simplicity in drawing, illustrated in a generally energized or actuated condition, that being, with contacts 148 and 152 closed. It might be noted here that with such contacts 148 and 152 closed, a related suitable source of electrical potential as schematically illustrated at 160 supplied current through blade terminal 48, through printed circuit portion B, conductor means 154, armature arm 128, contacts 152, 148, contact pedestal 140, rivet 46, blade terminal 44 and through electrical load means 162.

FIG. 8, a view based on FIG. 3 but simplified in many respects in comparison thereto, nevertheless, more explicit and descriptive of the preferred form of the relay structure especially as it relates to the mechanical components thereof. It will be noted that in the normal condition (with the circuit through the contacts 152 and 148 opened) the lower edge or surface 190 of armature plate 134 is at an incline with respect to the top edges or surfaces 192 and 194 of side leg portions 90, 92 of outer core 86. The generally wedge-like gap between surface 190 and surfaces 192 and 194 is such as to have the widest opening of such gap directed, generally, toward the contact end or swingable end of armature arm 128. Further, for purposes of illustration, let it be assumed that when the coil means 100 is energized, the armature arm 128 and armature plate 134 will, as a unit, generally bendably pivot and swing counterclockwise about point P. During such energization of coil assembly 100 and corresponding actuation of armature assembly 124, armature arm 128 will swing causing contacts 152 to come into engagement with fixed contact 148. This is illustrated in phantom line at 152a. At the instant of such engagement between contacts 152 and 148, armature arm 128 will have assumed a position as generally depicted in phantom line at 128a and the lower edge or surface 190 of armature plate 134 will have assumed a position as generally depicted in phantom line at 190a. It should be noted that when the circuit through contacts 152 and 148 is thusly closed, a smaller wedge-like gap still exists between the lower surface 190 (now at position 190a) and upper surfaces 192 and 194. However, because of mechanical inertia of armature plate 134 and the fact that such surface 190 is now relatively close to surfaces 192 and 194 thereby enabling any residual magnetic flux to still exert some downward influence on armature plate 134, such armature plate continues to move downwardly until surface 190 thereof abuts against spaced upper surfaces 192 and 194.

Because the otherwise free downward movement of contact 152, once it attains position 152a, is generally prevented, the above-described continued downward movement of armature plate 134, from its position as at 190a until such surface 190 abuts against upper surfaces 192 and 194 results in generally a bowing of armature arm 128 as between contact 152 and armature plate 134. Such bowing of armature arm 128, in turn, causes an effective shortening of the straight-line distance between contact 152 and armature plate 134 with the result that contact 152 tends to rock about contact 148 causing a slight rubbing or wiping action between the contacting surfaces of contact members 152 and 148. Such rubbing or wiping action maintains the contacting surfaces cleaner for a much longer period of time and accordingly greatly increases the useful life of such contacts 152 and 148.

Another important feature which arises from the fact that in the normal or non-energized state the armature plate surface 190 forms a wedge-like gap with respect to upper surfaces 192 and 194, is that initial downward movement of the armature plate 134 is accomplished with the lowest possible resisting spring force of armature arm 128 since, it only starts to undergo bending at this time. However, the more armature arm 128 is deflected the more nearly surface 190 approaches surfaces 192 and 194 and, at the same time, such surface 190 progressively becomes more nearly parallel to surfaces 192 and 194. In other words, it can be seen that the increasing resilient resistance, developed by arm 128 during its bending about assumed point P, is compensated for by at least two factors. That is, the magnetic attraction for armature plate 134 increases because surface 190 is moving closer to surfaces 192 and 194 and, not only are such surfaces moving closer but are also undergoing relative rotation causing them to ultimately be parallel to each other. The relative rotation of such ultimately abutting surfaces also, in and of itself, increases the degree of magnetic attraction as compared to their respective positions at initiation of downward movement of armature assembly 128.

Although, in view of the teachings of the invention contained herein it is apparent that various means and structure may be employed whereby the wedge-like gap relationship can be achieved, in the preferred embodiment of the invention such wedge-like gap relationship is attained by inclining the armature arm 128 with respect to the horizontal (as viewed in FIG. 8 and FIG. 3 on which such FIG. 8 is based). The simplest and preferred means for achieving such inclination of armature arm 128 is to form the mounting flange or bracket portion 126 as to have the upper surface 198 thereof in suitably corresponding inclined plane so that when the arm 128 is mounted and secured thereto the cantilevered portion thereof will assume the desired degree of inclination with respect to the horizontal.

Further, the invention provides structure whereby the strength of the magnetic field, for causing downward movement of the armature assembly 124, is increased as compared to the prior art for the same ampere-turns. This is achieved by the use of an inner core 118 and an outer core 86 having upstanding legs 90 and 92. As a consequence of such inner and outer cores a double magnetic loop is created upon energization of the coil assembly 100 thereby, in turn, creating a higher armature pull-in force than otherwise possible.

The benefits of the invention thus far described become even more significant when such are compared to the prior art. That is, prior art armature-actuating coil assemblies, without such double-magnetic loop creating means required a much greater number of coil turns to attain the same armature pull-in force. In most instances, the actual number of such coil turns was so great that the prior art attempted to reduce or somewhat limit the number of coil turns by placing the electrical contacts very close to each other and, at the same time, increase the spring rate of the armature assembly. This approach by the prior art, however, has not proven to be successful especially where the coil and armature contact assembly, during use, is subjected to any significant degree of shock or vibration. That is, because of the very small contact gap such vibrations cause contact closure even during periods of operation wherein such contact closure is not supposed to occur.

Figure 9:
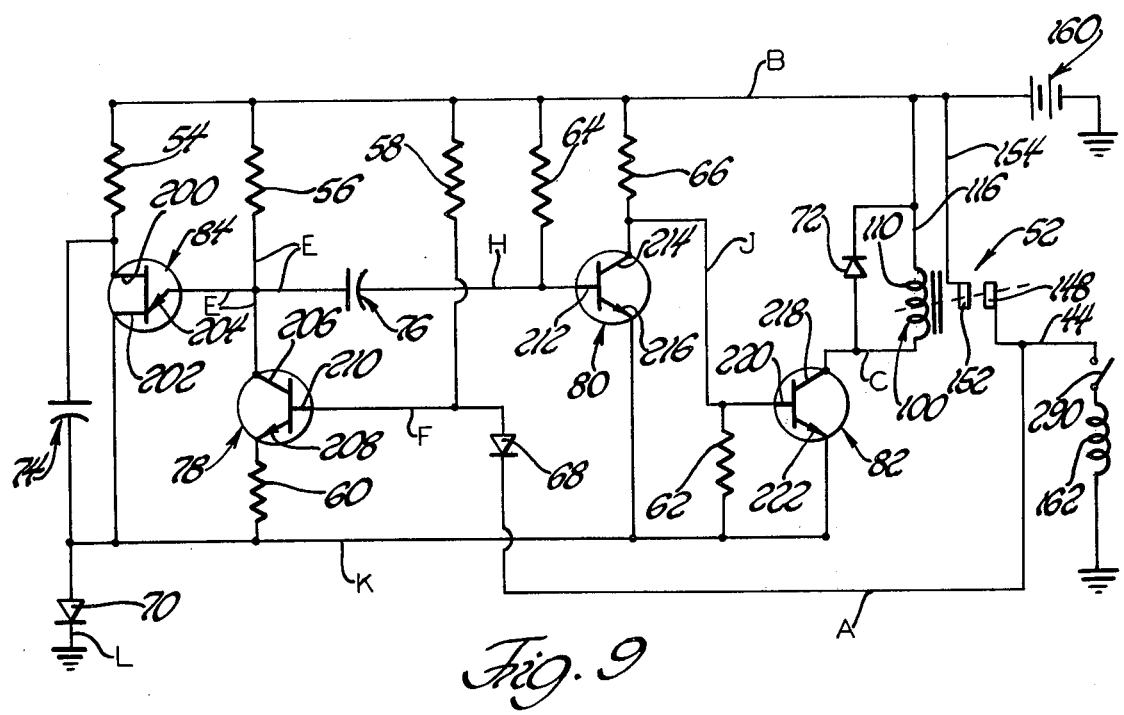
FIG. 9 is a schematic wiring diagram of circuitry, employable in the assembly of FIGS. 1–8, constructed in accordance with the teachings of the invention.

In FIG. 9, a schematic wiring diagram of circuitry employable in the structure of FIGS. 1–8, such of the various elements which correspond to those already identified in preceding Figures are identified with like reference numerals.

In the circuit of FIG. 9, an oscillator system is comprised of resistor 54, unijunction transistor (UJT) 84, capacitor 76, resistor 56, resistor 64 and transistor 80. As can be seen, the emitter 204 of the UJT is electrically coupled through capacitor 76 to the base terminal 212 of transistor 80 which, in turn, has its collector 214 connected, through resistor 66, to conductor B and source of electrical potential 160, while its emitter 216 is connected to ground via conductor K. The collector junction of transistor 80 is, in turn, electrically connected to base terminal 220 of transistor 82 which has its collector 218 electrically connected via conductor C to winding 110 of coil 100 and its emitter 222 connected to conductor K. It can be seen that when transistor 80 is turned "off" (nonconductive) base 220 of transistor 82 (which is an N-P-N type) is forward biased and transistor 82 is made conductive (turned "on") through its emitter-collector circuit thereby permitting current flow through coil 110 and causing closure of contacts 152 and 148. Transistor 82 not only serves as an inverting stage but also provides an amplification or gain stage in the circuit.

In the UJT, the base-one terminal 202 is electrically connected to ground while its base-two terminal 200 is electrically connected via resistor 54 to the source 160 as by conductor B. The UJT will not become conductive until such time as the voltage applied to the emitter 204 becomes larger than the intrinsic stand-off ratio multiplied by the voltage at the junction of the two base terminals. However, when the voltage applied to the emitter 204 does reach or exceed such value, the junction becomes forward biased and current will flow from the emitter 204 to the base-one 202. The resistance of the base-one terminal decreases with an increase of current flow; therefore, the process becomes regenerative with the result that the UJT exhibits a negative resistance characteristic.

In the embodiment illustrated, the UJT 84 remains non-conductive or "off" until the voltage applied to emitter 204 attains the magnitude previously described. This voltage for turning UJT 84 "on" is supplied by capacitor 76. That is, when UJT 84 is "off", transistor 80 is turned "on" thereby bringing the right side of capacitor to ground potential while the left side thereof is charged to a positive potential. During this time, capacitor 76 is charged through resistor 56. When capacitor 76 is sufficiently charged, the emitter voltage becomes equal to the peak point voltage and the resistance of base-one 202 drops. The capacitor 76 then discharges through the emitter 204 and base-one 202. When the capacitor 76 has discharged sufficiently the emitter 204 becomes reversed biased and the charging process is repeated.

At the time that capacitor 76 becomes sufficiently charged to cause UJT 84 to go into conduction, the charge on capacitor 76 is such as to cause base 212 of transistor 80 to become highly negative so as to thereby cause transistor 80 to be turned "off". Transistor 80 will remain in an "off" condition until capacitor 76 discharges through resistor 64 and the UJT 84 and the current passing through the emitter reaches the minimum of the valley point current at which time the UJT 84 starts to turn "off" and capacitor 76 again starts to charge and transistor 80 again becomes forward biased and starts to go into conduction (turned "on"). The charging time is basically determined by capacitor 76 and resistance means 56. Therefore, it can be seen that the "on" time of transistor 80 and the "off" time of transistor 82 is basically determined by the charging time while the "off" time of transistor 80 and the "on" time of transistor 82 is determined basically by the discharge time of capacitor 76.

Transistor 78 is provided in order to shut down the oscillator in the event of the absence of the existence of an electrical load. That is, if, for example, a related manually operated switch 290 is opened, conductor F will in effect be placed at positive line voltage potential thereby forward biasing the base emitter of transistor 78 and causing the transistor 78 to be turned "on". When this happens, capacitor 76, because of the resulting voltage divider network comprised of resistors 56 and 60, will be incapable of becoming sufficiently charged to turn "on" the UJT 84. Therefore, during such a condition of operation, the UJT 84 remains "off" as does transistor 82.

However, when switch 290 is closed, conductor A being then placed in circuit causes the forward bias previously existing on base terminal 210 to be sufficiently reduced as to turn the transistor 78 "off" and place conductor E at substantially the positive potential of conductor B thereby permitting capacitor 76 to become sufficiently charged to, in turn, cause the UJT to again turn "on" as previously described.

Diode 72 is placed across winding 110 of coil 100 to provide for reverse transient protection for transistor 82 while diode 68 serves as an isolation diode in case the electrical load goes positive and thereby possibly result in the destruction of the base emitter junction of transistor 78. Further, diode 70 is provided to protect the circuit against possible reverse polarities as might be developed in related structure. Somewhat for similar purposes, capacitor 74 is provided to prevent any possible stray voltage signals from being fed back to the UJT 84 and thereby effect its operation.

Figure 10:
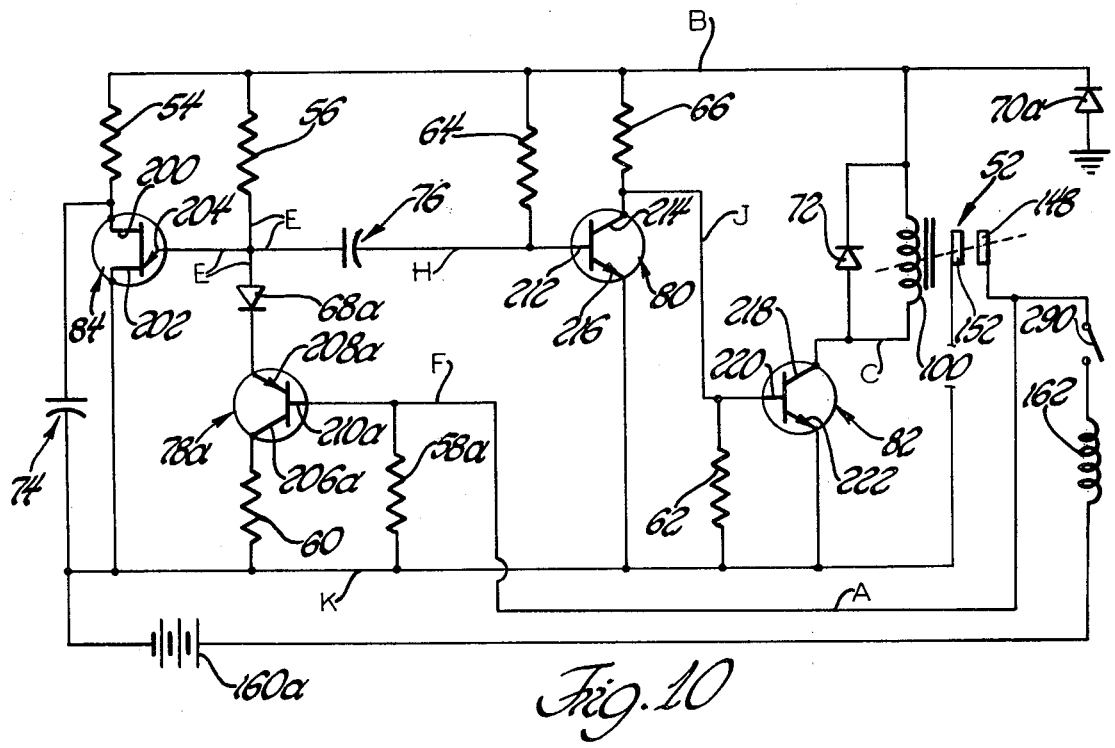
FIG. 10 is a schematic wiring diagram of circuitry, employable in the assembly of FIGS. 1–8, constructed in accordance with the teachings of the invention.
Figure 14:
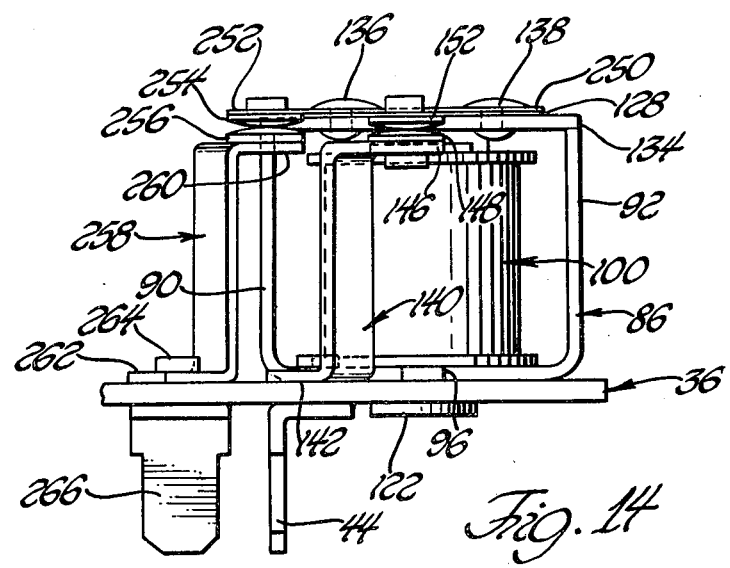
FIG. 14 is a view taken generally on the plane of line 14—14 of FIG. 12 and looking in the direction of the arrows.

FIG. 10 is a schematic wiring diagram like that of FIG. 9 except that modifications, as are evident in the drawing, have been made to permit the circuitry to be used in a system employing a positive ground. The primary changes are the relocation of diode 68 which in FIG. 10 is identified as 68a, the substitution of a P-N-P transistor 78a in FIG. 10 for the N-P-N transistor 78 of FIG. 9, the relocation of diode 70 which in FIG. 10 is identified as 70a and the relocation of resistor 58 which in FIG. 10 is identified as 58a. Otherwise, giving due consideration for the reversal of polarities, the operation of the circuitry of FIG. 10 is like that of FIG. 9.

FIGS. 11–14 illustrate a modification of the invention. All elements in the embodiment of FIGS. 11–14, except as noted to the contrary, are the same as those of FIGS. 1–8 and are, therefore, identified with like reference numerals.

In the embodiment of FIGS. 11–14, the relay assembly 52a is modified by the provision of a second electrically conductive armature arm member 250 which is secured, in electrically conductive engagement, with armature arm 128 as by rivets 136 and 138. The swingable end extension 252 thereof carries an electrical contact member 254 which is adapted to at times engage a second fixed electrical contact 256 carried as by a laterally extending flange 260 of an electrically conductive contact pedestal member 258 having its base 262 secured to circuit board 36 as by an electrically conductive rivet 264 which also engages and retains a third blade-type terminal 266.

As previously explained with reference to FIGS. 1–7 and FIG. 8, the structure of FIGS. 11–14 is shown in the energized condition with contacts 152–148 and 254–256 respectively closed even though such contacts are normally open. As was also explained with reference to FIG. 8, the preferred form of the armature assembly 124a and related components is that as depicted in and explained with reference to FIG. 8.

Nevertheless, an inspection of FIGS. 11–14 will clearly show that each time armature assembly 124a is energized into a closed-contact condition, that two output circuits are closed with the first of such output circuits being completed through contacts 152–148 and the other of such output circuits being completed through contacts 254–256. In an arrangement wherein power is supplied to a main electrical load through contacts 152–148, the second set of contacts 254–256 might be employed to complete a circuit to, for example, a pilot light or lamp to thereby provide a signal indicating that such main power circuit has been closed.

Figure 15:
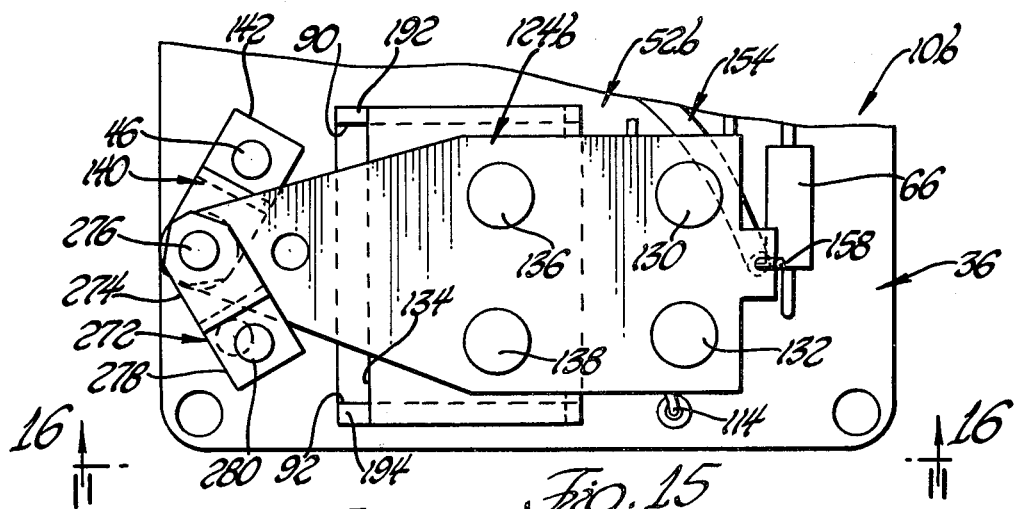
FIG. 15 is a view similar to FIGS. 4 and 13 but illustrating a third embodiment of the invention.
Figure 16:
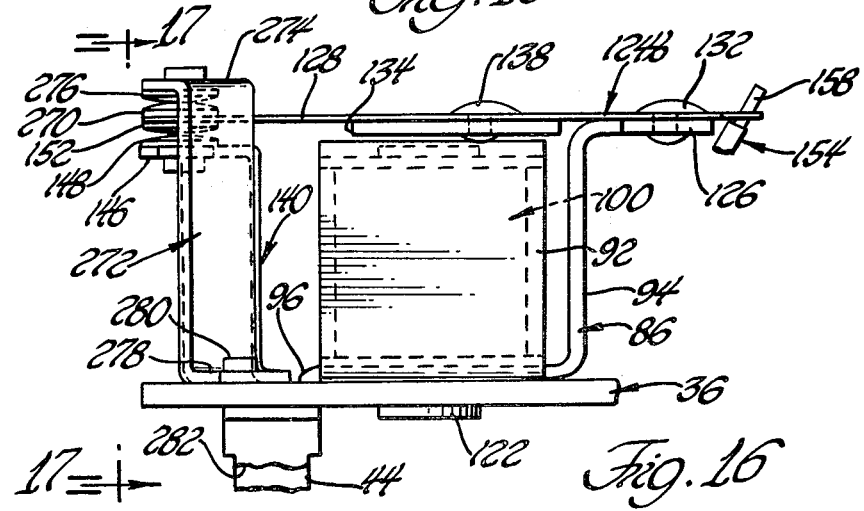
FIG. 16 is a view taken generally on the plane of line 16—16 of FIG. 15 and looking in the direction of the arrows.
Figure 17:
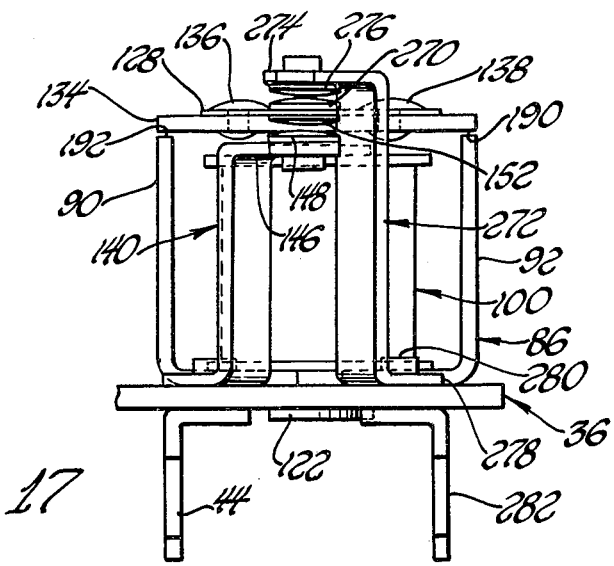
FIG. 17 is a view taken generally on the plane of line 17—17 of FIG. 16 and looking in the direction of the arrows.

FIGS. 15, 16, and 17 illustrate another modification of the invention. All elements in the embodiment of FIGS. 15–17, except as noted to the contrary, are the same as those of FIGS. 1–8 and are, therefore, identified with like reference numerals.

In the embodiment of FIGS. 15, 16 and 17, a second electrical contact 270 is added to the swingable end of armature arm 128 as to be upwardly directed thereform. A second electrically conductive contact pedestal 272, having an upper laterally extending flange or bracket-like portion 274 for carrying a downwardly directed contact member 276 thereon, is secured at its base 278 to the printed circuit board 36 as by an electrically conductive rivet 280 which extends therethrough and also secures a third blade-like terminal 282 thereto.

The embodiment of FIGS. 15, 16 and 17 is shown in its normal state wherein contacts 276 and 270 are closed. However, the preferred configuration of the outer core 86, flange 126 and armature assembly 124b is that as disclosed in FIG. 8 and described with reference thereto.

Figure 18:
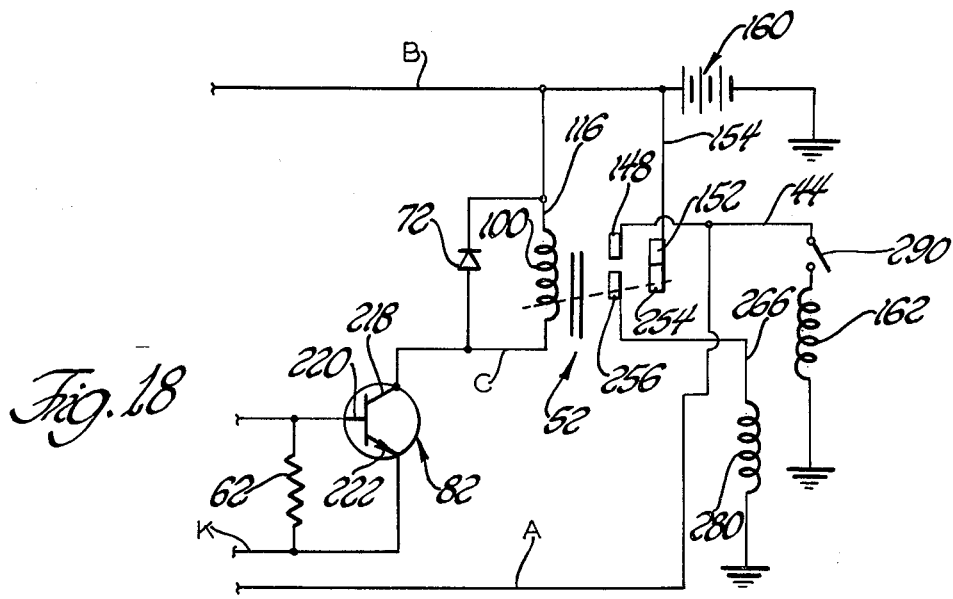
FIG. 18 is a fragmentarily illustrated schematic wiring diagram showing a modification of the circuitry of FIG. 9 as to have such employable in the embodiment of FIGS. 11–14.

In FIG. 18, a fragmentary schematic wiring diagram is based on the diagram of FIG. 9 and, except with such portions as are noted to the contrary, is identical thereto. FIG. 18 illustrates, schematically, the circuitry as would apply to the embodiment of FIGS. 11–14. That is, as shown, contact 148 is electrically connected to related electrical load means 162 which load means may in fact be a single or multiple electrical lamp such as often employed on vehicles where flashing of the lamps is desired to indicate hazard conditions. Contact 256 is shown electrically connected to electrical load means 280 which load means may in fact be an electrical pilot-type lamp located within the vehicle as to thereby, when energized, indicate to the vehicle operator that the main electrical load is also being energized.

Figure 19:
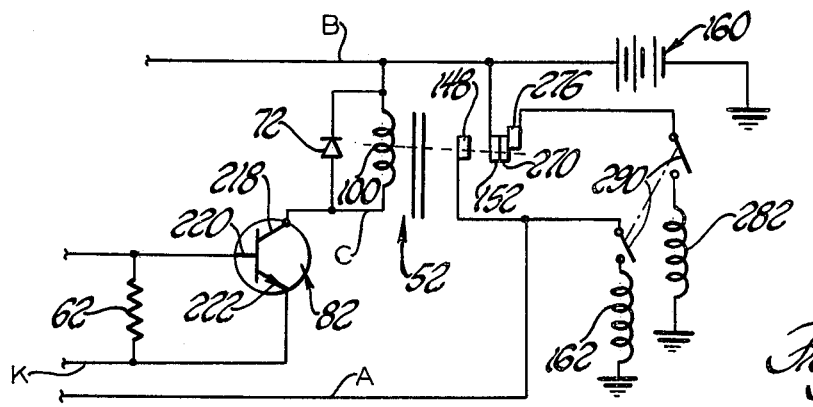
FIG. 19 is a fragmentarily illustrated schematic wiring diagram showing a modification of the circuitry of FIG. 9 as to have such employable in the embodiment of FIGS. 15–17.

In FIG. 19, a fragmentary schematic wiring diagram is based on the diagram of FIG. 9 and, except with such portions as are noted to the contrary, is identical thereto. FIG. 19 illustrates, schematically, the circuitry as would apply to the embodiment of FIGS. 15, 16 and 17. That is, as shown, contact 148 is electrically connected to related electrical load means 162 while contact 276 is electrically connected to related electrical load means 282. Such load means 162 and 282 may, in fact, be similar or identical electrical lamps situated as, for example, on opposite sides of a bus so that they are alternately simultaneously energized and de-energized.

It should, of course, be apparent that the invention herein disclosed even though exceptionally suited for use as a lamp flasher nevertheless is not limited to such application.

Although only a select number of preferred embodiments and modifications of the invention have been disclosed and described it is apparent that other embodiments and modifications of the invention are possible within the scope of the appended claims.

I claim:

1. A relay assembly, comprising coil means adapted to at times be electrically energized, first core means carried generally within said coil means, second core means carried generally externally of said coil means, said second core means comprising first second and third upwardly directed legs with said first and second legs respectively having first and second upper terminal surfaces substantially coplaner with each other, said second core means further comprising a relatively lower disposed base portion integrally formed with said first second and third legs, said first core means comprising an upper first core end and a lower first core end, said lower first core end being supported by said base portion, and resiliently deflectable armature means operatively carried by said third leg and adapted to be at times deflected in response to energization of said coil means, said armature means comprising an armature portion having downwardly directed terminal surface means, said armature means being so positioned as to result when said coil means is not energized in said downwardly directed terminal surface means and said first and second upper terminal surface means defining a wedgelike space therebetween, and said armature means being effective when undergoing deflection due to said coil means being energized for causing downwardly directed terminal surface means to more nearly approach a parallel relationship with said first and second upper terminal surfaces, upon energization of said coil means said first leg being effective to define a first magnetic flux loop through said first leg said armature portion of said first core means and that portion of said base generally between said first core means and said first leg while said second leg being effective to define a second magnetic flux loop through said second leg portion said first core means and that portion of said base generally between said first core means and said second leg while said third leg being effective to define a third magnetic flux loop through said third leg said armature portion said first core means and that portion of said base generally between said first core means and said third leg.

2. A relay assembly according to claim 1 wherein said third upwardly directed leg is situated generally medially of said first and second upwardly directed legs and positioned generally transversely thereto.

3. A relay assembly according to claim 1 wherein said first core means is generally cylindrical in configuration so as to have a first axial end define said upper first core end and a second axial end define said lower first core end, wherein said second core means has a generally U-shaped configuration defined generally by said base and first and second legs.

4. A relay assembly according to claim 3 and further comprising locator means carried by said second core means, said locator means being effective for cooperating with related positioning reference means carrid by related support structure for assuring the attainment of a preselected relative position of said second core means when assembled to such related support structure.

5. A relay assembly according to claim 4 wherein said locator means comprises a finger-like abutment portion formed integrally with said base and extending away therefrom.

6. A relay assembly according to claim 3 wherein said first and second upper terminal surfaces are generally normal to the cylindrical axis of said first core means.

7. A relay assembly according to claim 1 wherein said third leg further comprises an upwardly directed pedestal portion carried thereby and situated generally eccentrically of said coil means, said pedestal portion comprising an armature means mounting surface, wherein said armature means is secured generally at one end to said armature means mounting surface as to have a second end cantilevered therefromm, said armature means further comprising resiliently deflectable armature body means interconnecting said one end thereof and said second end thereof an being disposed in general juxtaposition to said upper first core end, and wherein said armature portion comprises a ferrous plate member carried by said armature body.

8. A relay assembly according to claim 7 wherein said armature means mounting surface is integrally formed on said third leg, and wherein the plane of said armature means mounting surface is inclined with respect to the axis of said first core means and said first and second upper terminal surface means.

9. A relay assembly, comprising coil means adapted to at times be electrically energized, first core means carried generally within said coil means, second core means carried generally externally of said coil means, said second core means comprising first and second upwardly directed legs respectively having first and second upper terminal surfaces substantially coplanar with each other, and resiliently deflectable armature means adapted to be at times deflected in response to energization of said coil means, said armature means comprising an armature portion having downwardly directed terminal surface means, said armature means being so positioned as to result when said coil means is not energized in said downwardly directed terminal surface means and said first and second upper terminal surface means defining a wedge-like space therebetween, said armature means being effective when undergoing deflection due to said coil means being energized for causing said downwardly directed terminal surface means to more nearly approach a parallel relationship with said first and second upper terminal surfaces, said first core means being generally cylindrically in configuration so as to have an upper first core end and a lower first core end, said second core means having a generally U-shaped configuration and comprising a lower bight portion serving as a base, said first and second upwardly directed legs being integrally formed with said bight portion and comprising opposed legs of said U-shaped configuration, said lower first core end being generally in contact with said bight portion, and further comprising an upwardly directed pedestal portion situated generally eccentrically of said coil means, said pedestal portion comprising an armature means mounting surface, said armature means being secured generally at one end to said armature means mounting surface as to have a second end cantilevered therefrom, said armature means further comprising resiliently deflectable armature body means inteconnecting said one end thereof and said second end thereof and being disposed in general juxtaposition to said upper first core end, said armature portion comprising a ferrous plate member carried by said armature body, said pedestal portion being integrally formed with said second core means, and said mounting surface being in a plane transverse to but inclined with respect to said cylindrical axis of said first core means.

10. A relay assembly, comprising coil means adapted to at times be electrically energized, first core means carried generally within said coil means, second core means carried generally externally of said coil means, said second core means comprising first and second upwardly directed legs respectively having first and second upper terminal surfaces substantially coplaner with each other, and resiliently deflectable armature means adapted to be at times deflected in response to energization of said coil means, said armature means comprising an armature portion having downwardly directed terminal surface means, said armature means being so positioned as to result when said coil means is not energized in said downwardly directed terminal surface means and said first and second upper terminal surface means defining a wedge-like space therebetween, said armature means being effective when undergoing deflection due to said coil means being energized for causing said downwardly directed terminal surface means to more nearly approach a parallel relationship with said first and second upper terminal surfaces, said first core means being generally cylindrical in configuration so as to have an upper first core end and a lower core end, said second core means having a generally U-shaped configuration and comprising a lower bight portion serving as a base, said first and second upwardly directed legs being integrally formed with said bight portion and comprising opposed legs of said U-shaped configuration, said lower first core end being generally in contact with said bight portion, and further comprising an upwardly directed pedestal portion situated generally eccentrically of said coil means, said pedestal portion comprising an armature means mounting surface, said armature means being secured generally at one end to said armature means mounting surface as to have a second end cantilevered therefrom, said armature means further comprising resiliently deflectable armature body means interconnecting said one end thereof and said second end thereof an being disposed in general juxtaposition to said upper first core end, said armature body, said pedestal portion being integrally formed with said bight portion, said pedestal portion having an upper disposed end defining a generally laterally extending flange portion said flange portion generally defining said mounting surface, said mounting surface being in a plane transverse to but inclined with respect to said cylindrical axis of said first core means, and said pedestal portion comprising formed surface means about which said resiliently deflectable armature body is resiliently deflected.

11. A relay assembly, comprising coil means adapted to at times be electrically energized, first core means carried generally within said coil means, second core means carried generally externally of said coil means, said second core means comprising first second and third upwardly directed legs with said first and second legs respectively having first and second upper terminal surfaces generally coplaner with each other, said second core means further comprising a relatively lower disposed base portion integrally formed with said first second and third legs, said first core means comprising an upper first core end and a lower first core end, said lower first core end being supported by said base portion, and resiliently deflectable armature means adapted to be at times deflected in response to energization of said coil means, said armature means comprising an armature portion having downwardly directed terminal surface means effective upon energization of said coil means to move toward said first and second upper terminal surface means, upon energization of said coil means said first leg being effective to define a first magnetic flux loop through said first leg said armature portion said first core means and that portion of said base generally between said first core means and said first leg while said second leg being effective to define a second magnetic flux loop through said second leg said armature portion and said first core means and that portion of said base generally between said first core means and said second leg while said third leg being effective to define a third magnetic flux loop through said third said armature portion said first core means and that portion of said base generally between said first core means and said third leg.

12. A relay assembly, comprising coil means adapted to at times be electrically energized, first core means carried generally within said coil means, second core means carried generally externally of said coil means, said second core means comprising first and second upwardly directed legs joined by an intermediate bight portion and respectively having first and second upper terminal surfaces generally coplanar with each other, and resiliently deflectable armature means adapted to be at times deflected in response to energization of said coil means, said armature means comprising an armature portion having downwardly directed terminal surface means, said armature means being so positioned as to result when said coil means is not energized in said downwardly directed terminal surface means and said first and second upper terminal surface means defining a wedge-like space therebetween, and said armature means being effective when undergoing deflection due to said coil means being energized for causing said downwardly directed terminal surface means to more nearly approach a parallel relationship with said first and second upper terminal surfaces, and further comprising an upwardly directed pedestal portion integrally formed with said bight portion and situated generally eccentrically of said coil means, said pedestal portion comprising an armature means mounting surface being in a plane transverse to but inclined with respect to the axis of revolution of said coil means.

13. A relay assembly, comprising coil means adapted to at times be electrically energized, first core means carried generally within said coil means, second core means carried generally externally of said coil means, said second core means comprising first and second upwardly directed legs joined by an intermediate bight portion and respectively having first and second uper terminal surfaces generally coplanar with each other, and resiliently deflectable armature means adapted to be at times deflected in response to energization of said coil means, said armature means comprising a resiliently deflectable armature body and an armature portion carried thereby having downwardly directed terminal surface means, said armature means being so positioned as to result when said coil means is not energized in said downwardly directed terminal surface means and said first and second upper terminal surface means defining a wedge-like space therebetween, and said armture means being effective when undergoing deflection due to said coil means being energized for causing said downwardly directed terminal surface means to more nearly approach a parallel relationship with said first and second upper terminal surfaces, and further comprising an upwardly directed pedestal portion integrally formed with said bight portion, said pedestal portion having an upper disposed end defining a generally laterally extending flange portion generally defining said mounting surface, said mounting surface being in a plane transverse to but inclined with respect to the axis of revolution of said coil means, and said pedestal portion comprising formed surface means about which said resiliently deflectable armature body is resiliently deflected.

* * * * *

UNITED STATES PATENT OFFICE
CERTIFICATE OF CORRECTION

PATENT NO. : 3,997,859
DATED : December 14, 1976
INVENTOR(S) : Gerald K. Miller

It is certified that error appears in the above-identified patent and that said Letters Patent are hereby corrected as shown below:

Column 4, line 19, change "radically" to ---radially---.

Column 5, line 19, between "thereto," and "nevertheless" insert ---is,---.

Claim 1, line 35 thereof, between "second leg" and "portion" insert ---said armature---.

Claim 7, line 8 thereof, cancel "therefromm" and substitute therefor ---therefrom---.

Claim 7, line 11 thereof, change "an" to ---and---.

Claim 10, line 24 thereof, between "a lower" and "core end" insert ---first---.

Claim 10, line 39 thereof, between "thereof" and "being" change "an" to ---and---.

Claim 10, line 41, thereof, between "said armature" and "body" insert ---portion comprising a ferrous plate member carried by said armature ---.

Claim 10, line 44 thereof, between "flange portion" and "said" insert a comma (,).

UNITED STATES PATENT OFFICE
CERTIFICATE OF CORRECTION

PATENT NO. : 3,997,859
DATED : December 14, 1976
INVENTOR(S) : Gerald K. Miller

It is certified that error appears in the above-identified patent and that said Letters Patent are hereby corrected as shown below:

Claim 11, line 31 thereof, between "third" and "said" insert ---leg---.

Claim 13, line 27 thereof, between "flange portion" and "generally" insert ---, said flange portion---.

Signed and Sealed this

*Twenty-seventh* Day of *June 1978*

[SEAL]

Attest:

RUTH C. MASON
*Attesting Officer*

DONALD W. BANNER
*Commissioner of Patents and Trademarks*